United States Patent
Jang et al.

(10) Patent No.: US 10,707,071 B2
(45) Date of Patent: Jul. 7, 2020

(54) SUBSTRATE PROCESSING APPARATUS AND SUBSTRATE PROCESSING SYSTEM INCLUDING THE SAME

(71) Applicant: Samsung Electronics Co., Ltd, Suwon-si, Gyeonggi-do (KR)

(72) Inventors: Won-Ho Jang, Hwaseong-si (KR); Hyun-Jung Lee, Goyang-si (KR); Se-Jin Park, Suwon-si (KR); Yong-Sun Ko, Suwon-si (KR); Dong-Gyun Han, Yongin-si (KR); Woo-Gwan Shim, Yongin-si (KR); Jeong-Yong Bae, Cheonan-si (KR); Woo-Young Kim, Cheonan-si (KR); Boong Kim, Cheonan-si (KR)

(73) Assignees: Samsung Electronics Co., Ltd., Gyeonggi-do (KR); Semes Co., Ltd., Chungcheongnam-do (KR)

( * ) Notice: Subject to any disclaimer, the term of this patent is extended or adjusted under 35 U.S.C. 154(b) by 132 days.

(21) Appl. No.: 15/826,916

(22) Filed: Nov. 30, 2017

(65) Prior Publication Data

US 2018/0190485 A1    Jul. 5, 2018

(30) Foreign Application Priority Data

Dec. 29, 2016   (KR) .......................... 10-2016-0182849

(51) Int. Cl.
*F26B 7/00* (2006.01)
*H01L 21/02* (2006.01)
(Continued)

(52) U.S. Cl.
CPC ...... *H01L 21/02101* (2013.01); *B08B 7/0021* (2013.01); *H01L 21/67017* (2013.01);
(Continued)

(58) Field of Classification Search
CPC ......... H01L 21/02101; H01L 21/67017; H01L 21/68742; H01L 21/67253;
(Continued)

(56) References Cited

U.S. PATENT DOCUMENTS 6,773,510 B2 *  8/2004  Kitano .............. H01L 21/67069
                                                    118/320
7,491,036 B2    2/2009  Parent et al.
(Continued)

FOREIGN PATENT DOCUMENTS

KR       10-0744145 B1     7/2007
KR     10-2008-0043748     5/2008
(Continued)

*Primary Examiner* — John P McCormack
(74) *Attorney, Agent, or Firm* — Harness, Dickey and Pierce, P.L.C.

(57) ABSTRACT

A substrate processing apparatus includes a chamber providing a space in which a substrate is processed, a first substrate support within the chamber and configured to support the substrate when the substrate is loaded into chamber, a second substrate support within the chamber and configured to support the substrate in a height greater than the height in which the first substrate supports the substrate, a first supply port through which a supercritical fluid is supplied to a first space under the substrate of a chamber space, a second supply port through which the supercritical fluid is supplied to a second space above the substrate of the chamber space, and an exhaust port through which the supercritical fluid is exhausted from the chamber.

19 Claims, 6 Drawing Sheets

(51) Int. Cl.
*H01L 21/67* (2006.01)
*B08B 7/00* (2006.01)
*H01L 21/687* (2006.01)
*B08B 3/08* (2006.01)

(52) U.S. Cl.
CPC .... *H01L 21/6719* (2013.01); *H01L 21/67034* (2013.01); *H01L 21/67103* (2013.01); *H01L 21/67248* (2013.01); *H01L 21/67253* (2013.01); *H01L 21/6875* (2013.01); *H01L 21/68742* (2013.01); *B08B 3/08* (2013.01); *B08B 2203/007* (2013.01)

(58) Field of Classification Search
CPC ........... H01L 21/67248; H01L 21/6719; H01L 21/67103; H01L 21/6875; H01L 21/67034; B08B 7/0021; B25J 9/0084
USPC .................................................... 34/442, 413
See application file for complete search history.

(56) References Cited

U.S. PATENT DOCUMENTS

| | | | |
|---|---|---|---|
| 7,520,938 | B2 | 4/2009 | Sakashita et al. |
| 8,084,367 | B2 | 12/2011 | Lee et al. |
| 8,898,926 | B2 | 12/2014 | Cho et al. |
| 9,027,576 | B2 | 5/2015 | Cho et al. |
| 2006/0102849 | A1* | 5/2006 | Mertens ................ G03F 7/707 250/440.11 |
| 2013/0025155 | A1 | 1/2013 | Kim et al. |
| 2013/0145640 | A1* | 6/2013 | Lee ......................... F26B 5/04 34/201 |
| 2014/0283886 | A1 | 9/2014 | Cho et al. |
| 2015/0162221 | A1 | 6/2015 | Lee et al. |
| 2016/0059277 | A1 | 3/2016 | Hong et al. |

FOREIGN PATENT DOCUMENTS

| | | |
|---|---|---|
| KR | 10-0837325 B1 | 6/2008 |
| KR | 10-1043714 B1 | 6/2011 |
| KR | 10-1096122 B1 | 12/2011 |
| KR | 10-2014-0112638 | 9/2014 |
| KR | 10-2016-0026302 | 3/2016 |
| KR | 10-2012-0067403 | 1/2017 |

\* cited by examiner

SUBSTRATE PROCESSING APPARATUS AND SUBSTRATE PROCESSING SYSTEM INCLUDING THE SAME

PRIORITY STATEMENT

This application claims priority under 35 U.S.C. § 119 to Korean Patent Application No. 10-2016-0182849, filed on Dec. 29, 2016 in the Korean Intellectual Property Office (KIPO), the contents of which are herein incorporated by reference in their entirety.

BACKGROUND

1. Field

Example embodiments relate to a substrate processing apparatus and/or a substrate processing system including the same. For example, at least some example embodiments relate to an apparatus for processing a substrate using a supercritical fluid and/or a substrate process system including the same.

2. Description of the Related Art

As a design rule of a semiconductor device is reduced, a critical dimension of the semiconductor device may also be reduced to about 20 nm to 30 nm or less. Thus, a process of forming a deep and shallow pattern having a relatively high aspect ratio of about 5 or more may be desired, and, therefore, a cleaning process and a dry process may be desired. In processes on a substrate having the pattern of the high aspect ratio formed thereon, for example, dry process, cleaning process, dry process, etc., methods using a supercritical fluid have been suggested and used.

However, in a substrate processing apparatus using the supercritical fluid, a substrate support may contact a peripheral region of the substrate to support the substrate. Accordingly, a middle region of the substrate may be bent due to a weight of a liquefied solvent thereon, thereby causing a failure in a supercritical dry process. Further, a large amount of the supercritical fluid may be used to maintain a supercritical phase with a high pressure and a high temperature in order to process the substrate, thereby increasing the time required for processing the substrate.

SUMMARY

At least some example embodiments provide a substrate processing apparatus capable of efficiently performing a supercritical fluid process.

At least some example embodiments provide a substrate processing system capable of reducing the time required for processing a substrate to improve productivity.

According to some example embodiments, a substrate processing apparatus may include a chamber providing a space to process a substrate; a first substrate support within the chamber, the first substrate support configured to support the substrate when the substrate is loaded into chamber; a second substrate support within the chamber, the second substrate support configured to support the substrate at a height greater than a height in which the first substrate support supports the substrate; a first supply port configured to supply a supercritical fluid to a first space under the substrate in the chamber; a second supply port configured to supply the supercritical fluid to a second space above the substrate in the chamber; and an exhaust port configured to exhaust the supercritical fluid from the chamber.

According to some example embodiments, a substrate processing apparatus may include a chamber providing a space to process a substrate, the chamber including an upper chamber and a lower chamber engageably clamped to each other, the upper chamber and the lower chamber configured to switch between a closed state where the chamber is closed and an open state where the chamber is open; a first substrate support within the chamber, the first substrate support configured to support the substrate in the open state when the substrate is loaded into chamber; a second substrate support within the chamber, the second substrate support configured to support the substrate in the close state when the substrate is processed in the chamber; a first supply port configured to supply a supercritical fluid to a first space under the substrate in the chamber; a second supply port configured to supply the supercritical fluid to a second space above the substrate in the chamber; and an exhaust port configured to exhaust the supercritical fluid from the chamber.

According to some example embodiments, the substrate processing apparatus may include a chamber; a first support system configured to support a substrate from a periphery of the substrate, if the chamber is in an open state; and a second support system configured to support the substrate from a middle portion thereof, if the chamber is in a closed state.

According to some example embodiments, a substrate processing system includes a substrate processing apparatus configured to support a substrate and configured to perform a supercritical process using a supercritical fluid on the substrate, a fluid supply module configured to supply the supercritical fluid to a chamber of the substrate processing apparatus to increase a pressure of the chamber and configured to adjust an amount of the supplied supercritical fluid before and after the critical point of a liquefied solvent on the substrate and the supercritical fluid within the chamber, and a fluid discharge module configured to discharge the supercritical fluid from the chamber.

According to some example embodiments, a substrate processing apparatus may include a first substrate support for supporting the substrate which is loaded into a chamber, and a second substrate support for supporting the substrate on which a supercritical dry process is performed. In a closed state of the chamber, the second substrate support may support the substrate at a position higher than the height in which the first substrate supports the substrate. Accordingly, the second substrate support may reduce a probability of (or, alternatively, prevent) the substrate being bent due to a weight of a liquefied solvent, to thereby improve efficiency of the superficial dry process.

Further, a substrate processing system may adjust a pressurization speed before and after the critical point of the fluid within the chamber, to thereby reduce total pressurization time.

BRIEF DESCRIPTION OF THE DRAWINGS

Example embodiments will be more clearly understood from the following detailed description taken in conjunction with the accompanying drawings.

FIG. 1 is a block diagram illustrating a substrate processing system in accordance with some example embodiments.

FIG. 2 is a cross-sectional view illustrating a substrate processing apparatus of the substrate processing system in FIG. 1.

FIG. 3 is a cross-sectional view illustrating the substrate processing apparatus in FIG. 2, in which a chamber is in an open state.

FIG. 4 is a plan view illustrating a first substrate support and a second substrate support of the substrate processing apparatus in FIG. 2.

FIG. 5 is a cross-sectional view illustrating a portion of the second substrate support supporting a substrate in the substrate processing apparatus in FIG. 2, in which the chamber is in a closed state.

FIG. 6 is a graph illustrating a pressure change within a chamber of the substrate processing apparatus in FIG. 1.

FIG. 7 is a cross-sectional view illustrating a substrate processing apparatus in accordance with some example embodiments.

FIG. 8 is a cross-sectional view illustrating the substrate processing apparatus in FIG. 7, in which a second substrate support moves downward.

FIG. 9 is a cross-sectional view illustrating the substrate processing apparatus in FIG. 7, in which a chamber is in an open state.

DETAILED DESCRIPTION

Hereinafter, example embodiments will be explained in detail with reference to the accompanying drawings.

Figure 1:
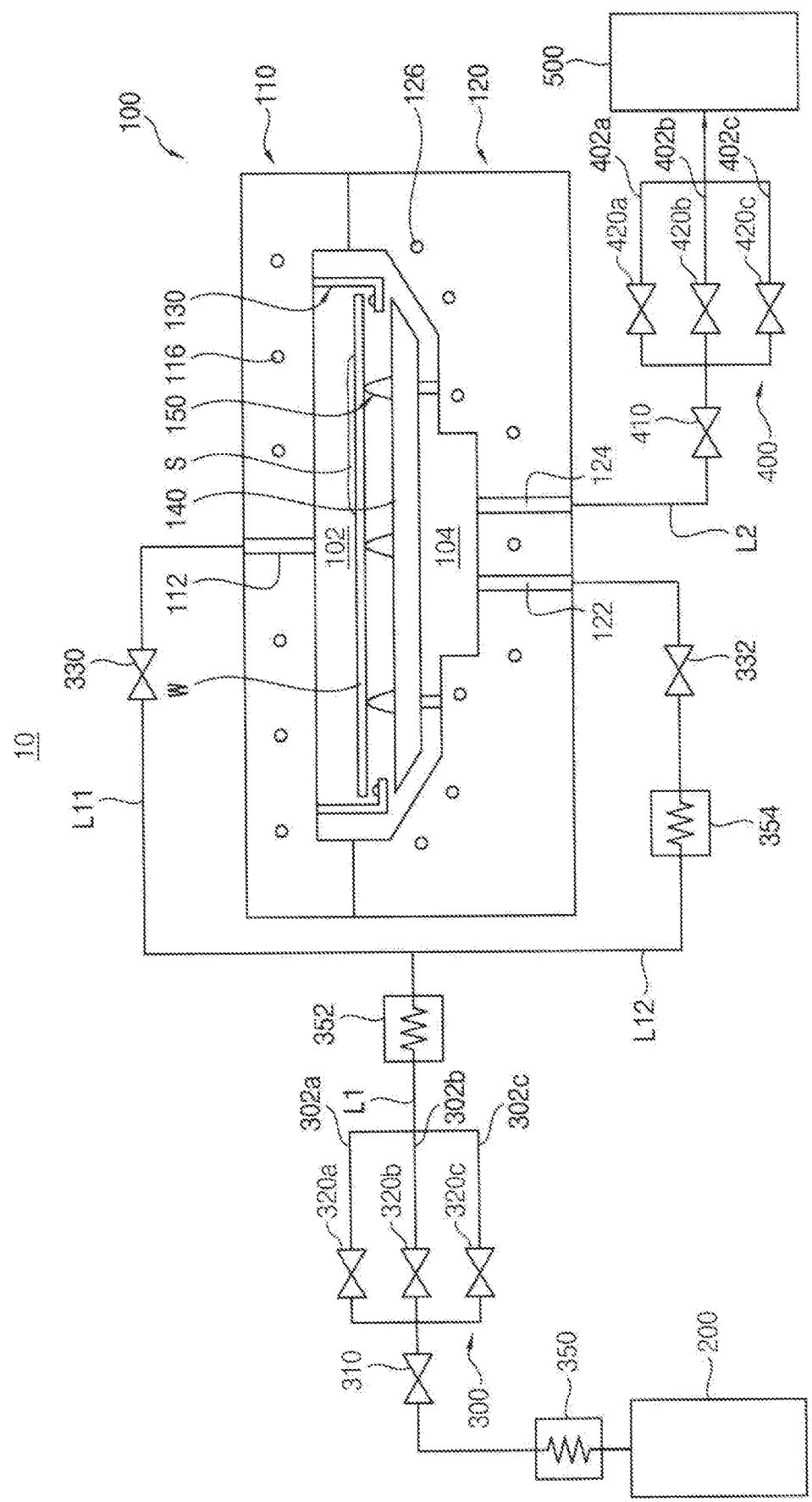
FIGS. 1 to 9 represent non-limiting, example embodiments as described herein.
Figure 2:
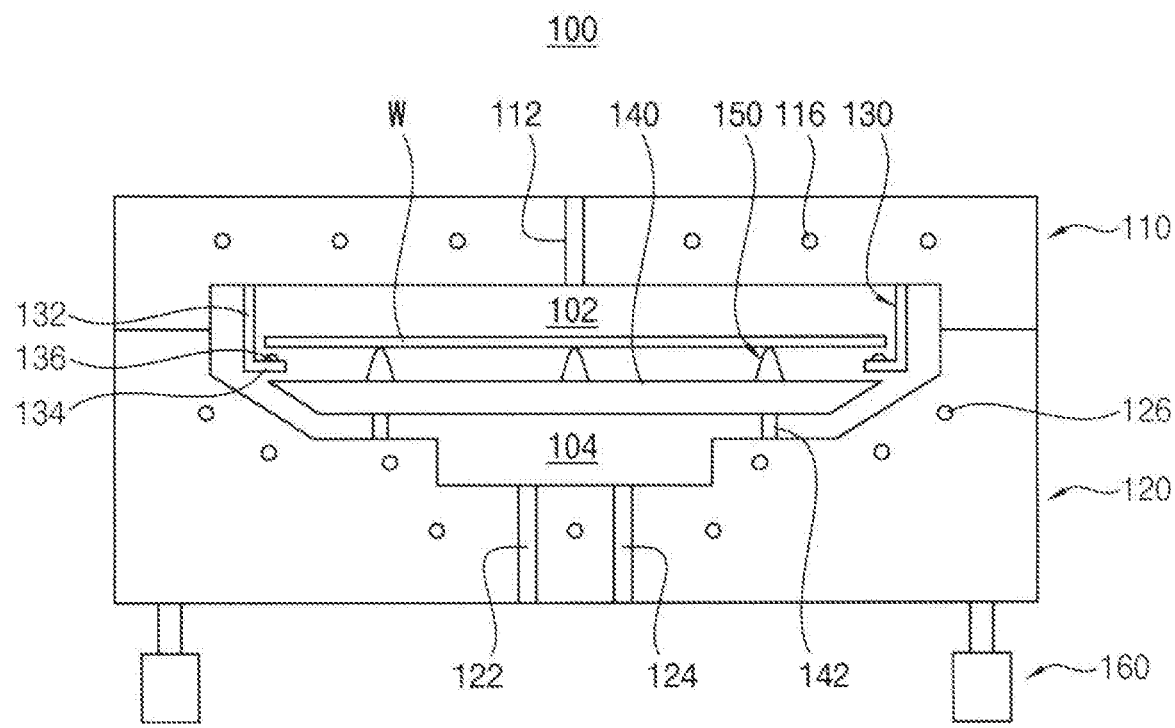
Figure 3:
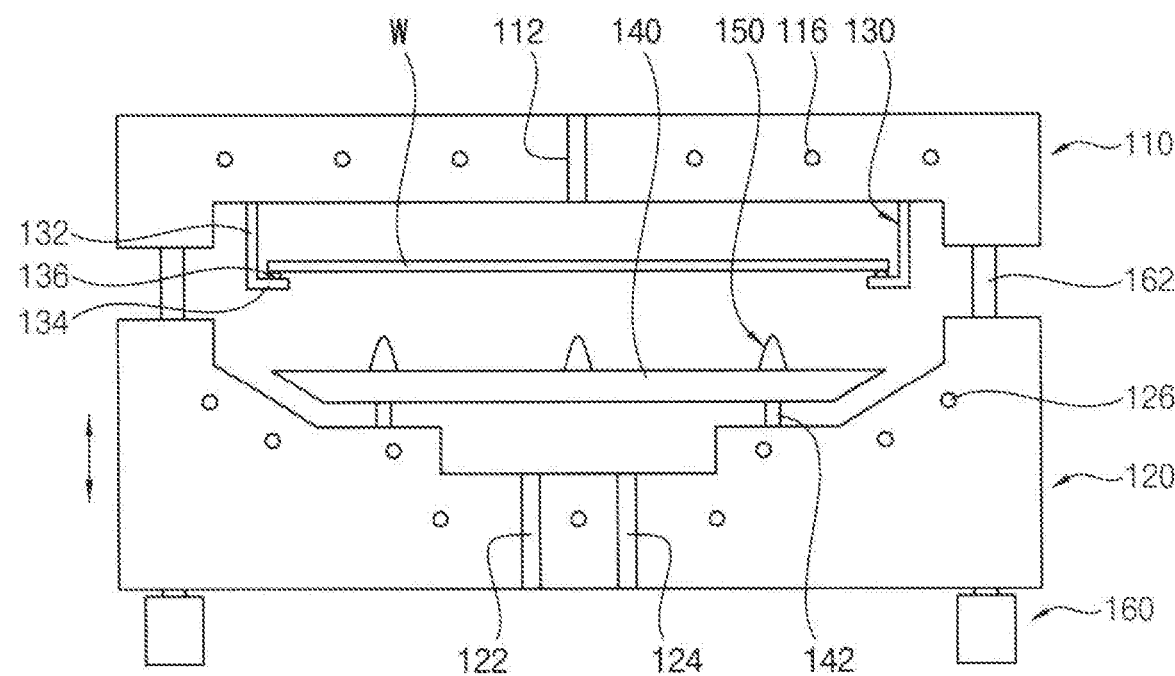
Figure 4:
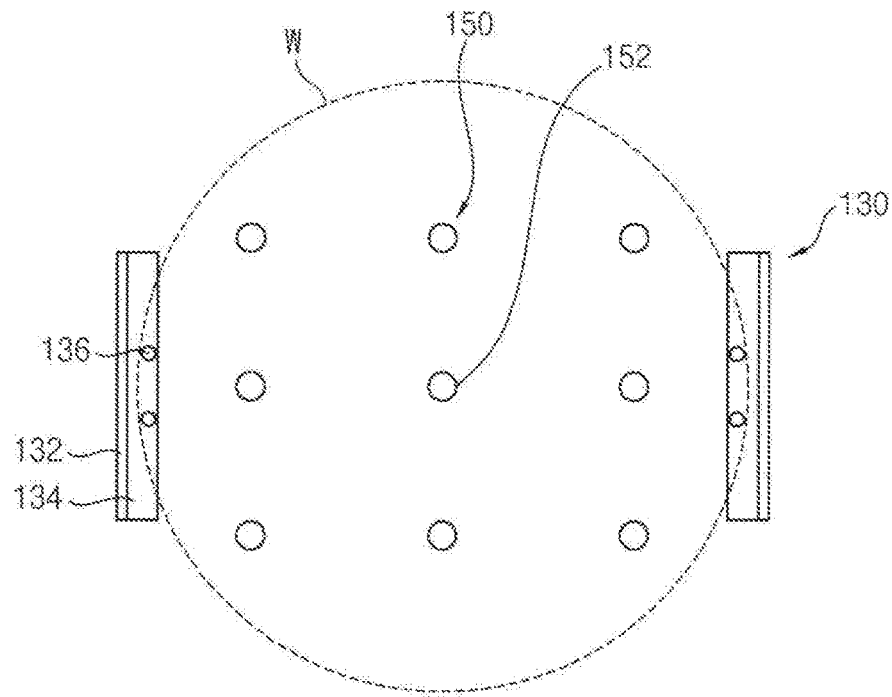
Figure 5:
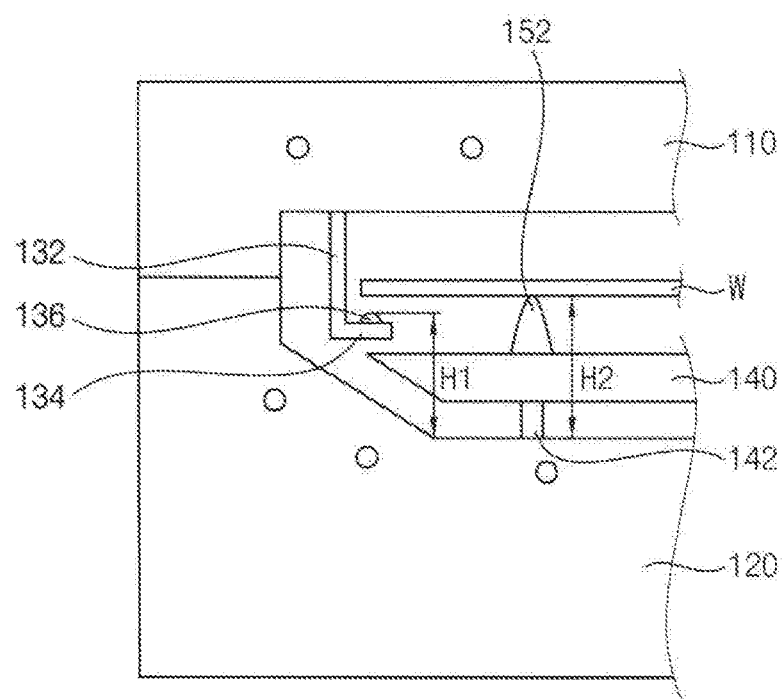

FIG. 1 is a block diagram illustrating a substrate processing system in accordance with some example embodiments. FIG. 2 is a cross-sectional view illustrating a substrate processing apparatus of the substrate processing system in FIG. 1. FIG. 3 is a cross-sectional view illustrating the substrate processing apparatus in FIG. 2, in which a chamber is in an open state. FIG. 4 is a plan view illustrating a first substrate support and a second substrate support of the substrate processing apparatus in FIG. 2. FIG. 5 is a cross-sectional view illustrating a portion of the second substrate support supporting a substrate in the substrate processing apparatus in FIG. 2, in which the chamber is in a closed state.

Referring to FIGS. 1 to 5, a substrate processing system 10 may include a substrate processing apparatus 100 configured to support a substrate such as a wafer W and configured to perform a supercritical process using a supercritical fluid on the substrate, a supercritical fluid generator 200 configured to generate the supercritical fluid, a fluid supply module 300 configured to supply the supercritical fluid from the supercritical fluid generator 200 to the substrate processing apparatus 100, and a fluid discharge module 400 configured to discharge the supercritical fluid from the substrate processing apparatus 100.

The supercritical process may include a cleaning process, a dry process, etc., using the supercritical fluid. The supercritical fluid may be any substance at a temperature and pressure above its critical point, where distinct liquid and gas phases do not exist. The supercritical fluid may has properties between a gas and a liquid such as low surface tension, low viscosity, high solvency and high diffusion coefficient. For example, the supercritical fluid may include carbon dioxide ($CO_2$), water ($H_2O$), methane ($CH_4$), ethane ($C_2H_6$), propane ($C_3H_8$), ethylene ($C_2H_4$), propylene ($C_3H_6$), methanol ($CH_3OH$), ethanol ($C_2H_5OH$), sulfur hexafluoride ($SF_6$), acetone (($CH_3)_2CO$), etc.

In some example embodiments, the substrate processing apparatus 100 may include a chamber, a first substrate support 130, a second substrate support 150, a first supply port 122, a second supply port 112 and an exhaust port 124. The substrate processing apparatus 100 may dry a substrate W on which a cleaning process is completed, using the supercritical fluid. In here, carbon dioxide ($CO_2$) may be used as the supercritical fluid.

As illustrated in FIG. 2, the chamber may provide a space for drying the substrate W. The space may include a process space 102 and a buffer space 104. The process space 102 may be a region including a liquefied solvent S on the substrate W and the buffer space 104 may be a region under the substrate W.

The chamber may include an upper chamber 110 and a lower chamber 120. The upper chamber 110 may include an upper wall and a first side wall. The upper wall of the upper chamber 110 may be provided as a top wall of the chamber. The first side wall of the upper chamber 110 may be provided as a portion of a sidewall of the chamber. The lower chamber 120 may include a lower wall and a second side wall. The lower wall of the lower chamber 120 may be provided as a bottom wall of the chamber. The second side wall of the lower chamber 120 may be provided as a portion of the sidewall of the chamber.

As illustrated in FIGS. 2 and 3, the upper chamber 110 and the lower chamber 120 may move relative to each other by a driving mechanism 160 such that the upper chamber 110 and the lower chamber 120 are engaged to each other to be switchable between a closed state where the chamber is closed and an open state where the chamber is open. For example, at least one of the upper chamber 110 and the lower chamber 120 may move upward and downward along an elevation rod 162 to close and open the chamber. In the open state of the chamber, the substrate W may be loaded/unloaded into/from the chamber. In the closed state of the chamber, a supercritical dry process may be performed on the substrate W.

The substrate processing system 10 may include a memory and processing circuitry (not shown).

The memory may include may include a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The processing circuitry may include a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design and/or execution of computer readable instructions stored in the memory, as a special purpose computer to control the driving mechanism 160 to open and/or close the chamber 110, 120.

The first substrate support (or, alternatively, the first support system) 130 may be disposed within the chamber to support the substrate W when the substrate W is loaded into the chamber. As illustrated in FIG. 3, when the substrate W is loaded/unloaded into/from the chamber in the open state of the chamber, the first substrate support 130 may support the substrate W. The second substrate support 150 (or, alternatively, the second support system) may be disposed within the chamber to support the substrate W when the substrate W is processed within the chamber. As illustrated in FIG. 2, when the supercritical process is performed on the substrate W in the closed state of the chamber, the second substrate support 150 may support the substrate W.

As illustrated in FIGS. 2 to 5, the first substrate support 130 may include a first support member which extends from the upper wall of the upper chamber 110 and supports the substrate W at a position spaced apart from the upper wall by a first distance. The first support member may support the substrate W in a first height H1 from the lower wall of the lower chamber 120 in the closed state of the chamber.

The first support member may include a first vertical rod 132 extending downwardly from the upper wall of the upper wall 110 and a first horizontal rod 134 extending in a horizontal direction from an end portion of the first vertical rod 132. The first support member may include at least one first support protrusion 136 which protrudes from the first horizontal rod 134 and contacts a periphery region of the substrate W to support the substrate W. Two first vertical rods 132 may be spaced apart from each other by a distance corresponding to a diameter of the substrate W, and two first horizontal rods 134 may be fastened to end portions of the first vertical rods 132 respectively. Accordingly, the first support member may support the peripheral region of the substrate W.

The substrate W loaded/unloaded into/from the chamber in the open state of the chamber may be supported temporarily by the first substrate support 130. The substrate W may be supported by the first substrate support 130 such that an upper surface of the substrate W faces the upper wall of the upper chamber 110 and a lower surface of the substrate W faces the lower wall of the lower chamber 120.

In some example embodiments, the substrate processing apparatus 100 may include a blocking plate 140 which is arranged between the lower wall of the lower chamber 120 and the first substrate support 130. The blocking plate 140 may be installed to be spaced apart from the lower wall of the lower chamber 120 by a desired (or, alternatively, a predetermined) distance. The blocking plate 140 may be fastened to the lower wall of the lower chamber 120 by a support rod 142. The blocking plate 140 may include a plate having a desired (or, alternatively, a predetermined) thickness to occupy a space within the buffer space 104. The blocking plate 140 may block the supercritical fluid supplied from the first supply port 122 from being sprayed directly toward a backside (lower surface) of the substrate W.

Additionally, a volume of the buffer space 104 may be reduced by the blocking plate 140. The volume of the buffer space 104 may be less than a volume of the process space 102. Accordingly, an amount of the supercritical fluid existing in the buffer space 104 under the substrate W may be relatively less than an amount of the supercritical fluid existing in the process space 102 above the substrate W. The blocking plate 140 may be disposed within the buffer space under the substrate W to reduce the volume of the buffer space and to reduce an amount of the supercritical fluid required for the dry process, thereby decreasing a process time.

The second substrate support 150 may include a second support member which supports the substrate W at a position spaced apart from the upper wall of the upper chamber 110 by a second distance. The second support member may support the substrate W in a second height H2 greater than the first height H1 from the lower wall of the lower chamber 120 in the closed state of the chamber.

The second support member may be disposed on the blocking plate 140 to support the substrate W. The second support member may include a plurality of second support protrusions 152 extending upwardly from a top surface of the blocking plate 140 and contacting a middle region of the substrate W to support the substrate W. Accordingly, the second support member may support the middle region of the substrate W.

The second support member may be arranged on the blocking plate 140, however, it may not be limited thereto. The second support member may be installed within the chamber to have a desired (or, alternatively, a predetermined) height from the lower wall of the lower chamber 120.

As illustrated in FIG. 5, in the closed state of the chamber, the second substrate support 150 may support the substrate W in a height greater than the height in which the first substrate support 130 supports the substrate W. The first support member of the first substrate support 130 may support the substrate W in the first height H1 from the bottom wall of the chamber, and the second support member of the second substrate support 150 may support the substrate W in the second height H2 greater than the first height H1 from the bottom wall of the chamber.

As illustrate in FIG. 3, as the lower chamber 120 moves downward to open the chamber, the second support protrusions 152 of the second substrate support 150 may move downward together with the lower chamber 120. Then, the substrate W may be loaded into the chamber and be seated on the first support protrusions 136 of the first substrate support 130. As illustrated in FIG. 2, as the lower chamber 120 moves upward to close the chamber, the second support protrusions 152 of the second substrate support 150 may move upward together with the lower chamber 120. Because the second support protrusions of the second substrate support 150 are higher than the first support protrusions 136 of the first substrate support 130 in the closed state of the chamber, the substrate W may be seated on the second support protrusions 152 of the second substrate support 150 moving upwardly. Then, a supercritical process may be performed on the substrate W which is supported by the second substrate support 150.

Alternatively, in the closed state of the chamber, the second substrate support 150 may support the substrate W in a height the same as the height in which the first substrate support 150 supports the substrate W. The supercritical process may be performed on the substrate W which is supported by the first substrate support 120 and the second substrate support 150. In this case, in the closed state of the chamber, the first substrate support 130 may support the peripheral region of the substrate W and the second substrate support 150 may support the middle region of the substrate W.

The first supply port 122 may be installed in the lower chamber 120. The first supply port 122 may be positioned in a middle region of the lower wall of the lower chamber 120. The supercritical fluid may be supplied to the buffer space 104 under the substrate W through the first supply port 122.

The second supply port 112 may be installed in the upper chamber 110. The second supply port 112 may be positioned in a middle region of the upper wall of the upper chamber 110. The supercritical fluid may be supplied to the process space 102 above the substrate W through the second supply port 112.

The exhaust port 124 may be installed in the lower chamber 120. The exhaust port 124 may be positioned in the middle region of the lower wall of the lower chamber 120 adjacent to the first supply port 122. A fluid used in the supercritical fluid process may be discharged from the chamber through the exhaust port 124. The discharged fluid may include the supercritical fluid with organic solvents. The fluid discharged through the exhaust port 124 may be supplied to a generating unit 500 to be separated into the supercritical fluid and the organic solvents.

In example embodiments, the substrate processing apparatus 100 may include a heater disposed in at least one of the top wall, the sidewall and the bottom wall of the chamber. The heater may heat the space within the chamber to maintain the supercritical fluid supplied into chamber at the critical temperature or above. For example, the heater may include a first heater 116 provided in the upper chamber 110 and a second heater 126 provided in the lower chamber 120.

As mentioned above, the substrate processing apparatus 100 may include the first substrate support 130 configured to support the substrate W which is loaded into the chamber and the second substrate support 150 configured to support the substrate W on which the supercritical dry process is performed. In the closed state of the chamber, the second substrate support 150 may support the substrate W at a position higher than the position at which the first substrate support 130 may support the substrate W. The second substrate support 150 may include a support member which contacts the middle region of the backside of the substrate W.

When the peripheral region of the substrate W is contacted and supported by the support member, the middle region of the substrate W may be bent due to a weight of the liquefied solvent S so that a layer thickness of the liquefied solvent S on the peripheral region of the substrate W may be decreased. When the supercritical fluid is supplied to the backside or a side of the substrate W through the first supply port 122, the liquefied solvent s on the peripheral region of the substrate W may be dried before the supercritical fluid reaches the critical pressure Pc, thereby causing a failure in the dry process.

The second substrate support 150 of the substrate processing apparatus 100 according to example embodiments may reduce a probability of (or, alternatively, prevent) the substrate W from being bent due to the weight of the liquefied solvent, to thereby efficiently substitute the liquefied solvent with a fluid of the supercritical phase.

Hereinafter, a method of drying a substrate using the substrate processing system in FIG. 1 will be explained in detail.

Figure 6:
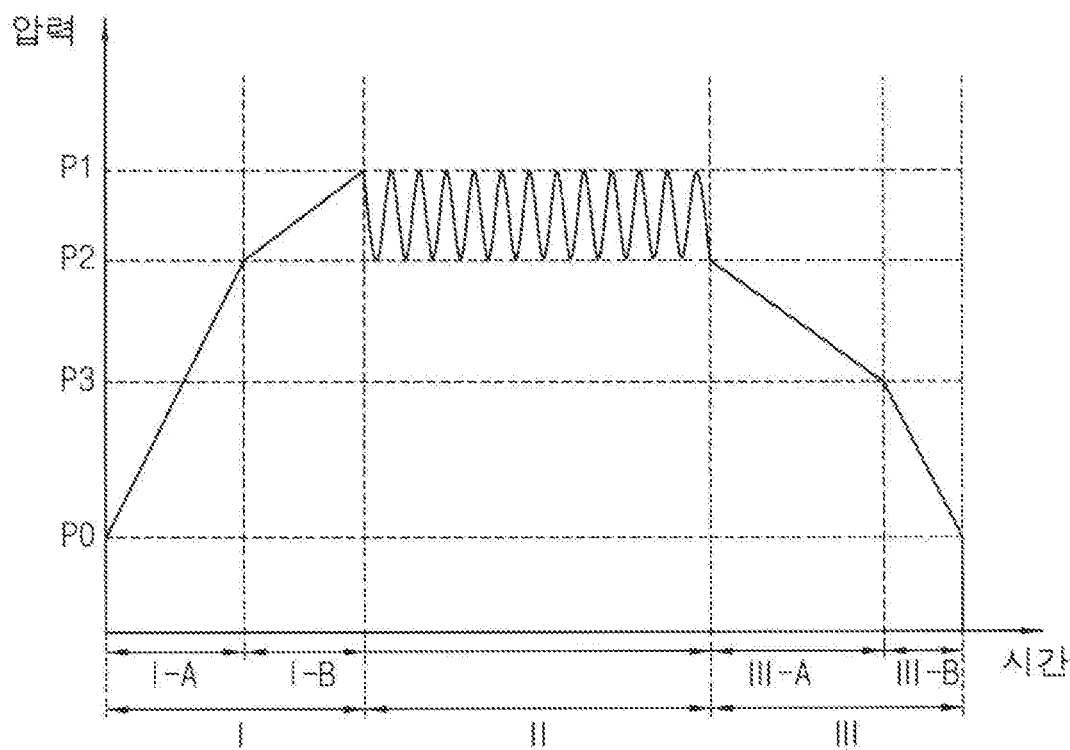

FIG. 6 is a graph illustrating a pressure change within a chamber of the substrate processing apparatus in FIG. 1.

Referring to FIGS. 1 to 6, first, as illustrated in FIG. 3, the lower chamber 120 may move downward to open the chamber, and then, a substrate W may be loaded into the chamber and be seated on the first support protrusions 136 of the first substrate support 130.

Then, as illustrated in FIG. 2, the lower chamber 120 may move upward to close the chamber, and the second support protrusions 152 of the second substrate support 150 may move upward together with the lower chamber 120 to contact and the support a middle region of the substrate W.

Then, a dry process using a supercritical fluid may be performed on the substrate W within the chamber. In particular, a liquefied solvent S remaining in a process before the dry process, for example, rinse process, may be mixed (substituted) with a supercritical phase fluid and then exhausted, to remove the solvent S from the substrate.

In particular, in the dry process, a pressurization stage I for generating a supercritical phase with a high pressure and a high temperature, a substitution stage, that is, dry stage II for removing a mixed liquefied solvent, and a depressurization stage, that is, discharge stage III for depressurizing to an atmospheric pressure. The pressurization stage I may include a high-speed pressurization stage I-A and a low-speed pressurization stage I-B. The depressurization stage III may include a low-speed depressurization stage III-A and a high-speed pressurization stage III-B. The pressure of the chamber of the substrate processing apparatus 100 may be controlled to vary over time according to the pressurization stage I, the dry stage II and the discharge stage III.

The fluid supply module 300 may supply a supercritical fluid into the chamber to increase the pressure within the chamber. In particular, the fluid supply module 300 may control a supply amount (or supply rate) of the supercritical fluid before and after the critical point of a mixture of a liquefied solvent S on the substrate W and the supercritical fluid in consideration of a phase behavior (phase change) of the mixture. The fluid supply module 300 may change a pressurizing speed before and after the critical pressure Pc of the mixture with reference to the critical pressure of the mixture, to thereby reduce total pressurization time.

The fluid discharge module 400 may discharge the supercritical fluid from the chamber. The fluid discharge module 400 may adjust a discharge amount of the supercritical fluid in consideration of the phase behavior of the supercritical fluid within the chamber to maintain the chamber at a temperature higher than the critical temperature of the supercritical fluid.

In example embodiments, in the pressurization stage I, a pressurization speed may be adjusted in consideration of the phase behavior of the material within the chamber to decrease the time required for the pressurization. In particular, the chamber may be pressurized in a relatively high speed until the pressure in which the liquefied solvent S remaining in the precedent process and the supplied supercritical fluid do not form a single phase (high-speed pressurization stage I-A), and then, the chamber may be pressurized in a relatively low speed after the pressure in which the liquefied solvent S and the supplied supercritical fluid form a single phase (low-speed pressurization stage I-B), thereby reducing a probability of (or, alternatively, preventing) a pattern collapse due to the flow of the fluid and decreasing the time required for the pressurization stage.

For example, any one of 3-step control lines, that is, first control lines 302a, 302b, 302c of the fluid supply module 300, in which a plurality of first control valves 320a, 320b, 320c is installed respectively, may be selected to adjust the pressurization speed without a mass flow controller. In an initial stage of the pressurization stage, the pressurization speed may be controlled in two or more steps to decrease the time required for the initial pressurization stage.

In the high-speed pressurization stage I-A, a substitution solvent (supercritical fluid) may be supplied at a first speed to a backside or side of the substrate W through a first supply line L12 and the first supply port 122. After the chamber reaches the pressure in which the liquefied solvent S and the substitution solvent form a single phase or a density change to a pressure change becomes relatively small, for example, the critical point (critical temperature and critical pressure), the low-speed pressurization stage I-B may be performed. In the low-speed pressurization stage I-B, the supercritical fluid may be supplied at a second speed smaller than the first speed onto a surface of the substrate W to efficiently mix the liquefied solvent S and the supercritical fluid, thereby decreasing the time required for the solvent substitution.

The fluid supply module 300 may supply the supercritical fluid in a relatively high speed before the critical point (critical temperature and critical pressure) of the mixture of the liquefied solvent and the supercritical fluid in consideration of the phase behavior of the mixture, and may supply the supercritical fluid in a relatively low speed after the critical point of the mixture. Because phases of the liquefied solvent and the supercritical fluid or gaseous solvent are separated from each other in the section below the critical point of the mixture, the liquefied solvent S may cover a pattern on the substrate to protect the pattern from the rapidly supplied supercritical fluid or gaseous solvent, thereby reducing a probability of (or, alternatively, preventing) variations of the pattern.

Additionally, a volume ratio of the liquefied solvent S on the surface of the substrate W and the supplied supercritical fluid may be set to have a desired (or, alternatively, predetermined) ratio value or more. The greater the volume ratio value is, the greater the substitution ratio may be. The minimum value of the volume ratio is changed according to the temperature and the pressure, and the minimum value of the volume ratio may be determined in consideration of the solubility and the dissolution behavior, etc. of the supercritical fluid at corresponding temperature and pressure.

The greater that the volume of the process space 102 above the substrate W, the more rapidly the liquefied solvent S on the surface of the substrate W and the supplied supercritical fluid form a supercritical phase without phase separation. The ratio of the liquefied solvent S and the supercritical drying solvent may be determined according to a distance between the surface of the substrate W and the top wall of the chamber (process space 102). The greater the process space is, the greater the substitution efficiency is, but the greater the process space is, the more the supercritical fluid may be needed, and this extra supercritical fluid may need more time in pressurizing the chamber. Accordingly, it may be desirable to design (or, alternatively, optimize) the distance (process space). When the ratio of the liquefied solvent S and the supercritical solvent is about 10 to 30, the optimal substitution efficiency may be obtained, while when the ratio is about 10 or less, damages to the substrate or variations of the pattern may be caused.

Because the liquefied solvent S on the substrate W is substituted with the supercritical fluid to be removed from the substrate W, the amount of the supercritical fluid in exiting in the process space 102 which contacts the liquefied solvent S may be relatively more important than the buffer space 104 under the substrate W, and the supercritical fluid exiting in the buffer space 104 under the substrate W may affect directly on the substitution of the liquefied solvent during the dry process which needs several or tens of minutes. Accordingly, in order to reduce an amount of the supercritical fluid used in the dry process and maintain the process performance, the plate structure 140 occupying the space 104 under the substrate W may be used to reduce the process time.

Additionally, a guide structure may be provided between the plate structure 140 and the lower wall of the lower chamber 120 to control a flow direction of the fluid within the high pressure chamber, to thereby efficiently substitute the liquefied solvent S.

Additionally, the supercritical fluid may be stored at a high pressure in the supercritical fluid generator 200 and then may be introduced into the dry process chamber through the lines L1, L11, L12 and valves 310, 320a, 320b, 320c, 330, 332 of the fluid supply module 300. When the supercritical fluid is introduced, the supercritical fluid flowing through the lines may be cooled due to pressure drops at the valve and connection portions of the lines, and then, may be liquefied or solidified to generate contamination particles on the substrate. Accordingly, in order to reduce a probability of (or, alternatively, prevent) the cooling of the supercritical fluid, it may be desirable to maintain the supercritical fluid to the critical point or above. Further, in case that the pressurization speed is increased, when only the temperature of the lines is maintained, it may be inadequate for sufficient heat transfer. Thus, additional heat exchangers 350, 352, 354 (or temperature control jackets) may be installed to minimize phase change of the fluid moving from the supercritical fluid generator 200 to the dry process chamber 100 and to reduce density change due to the temperature, thereby easily controlling the time required for pressurizing and depressurizing.

In some example embodiments, a flushing process may be performed in the substitution stage II. In the flushing process, a depressurizing process and a pressurizing process may be performed alternately and repeatedly between a first pressure P1 and a second pressure P2. For example, the process in which a certain amount of a pressure control fluid is supplied into the chamber through the second supply line L11 and the second supply port 112 and the process in which a gas in the process space 102 is discharged through the exhaust port 124 may be repeated alternately.

In some example embodiments, in the depressurization stage III, a discharge rate, that is, a depressurization speed may be adjusted to maintain the chamber to a temperature of the critical temperature or above such that the supercritical fluid is not changed into a liquid phase, thereby decreasing the time required for the depressurization.

In particular, in the depressurization stage III, a low-speed discharge stage (the low-speed depressurization stage III-A) in which the process space 102 of the chamber is depressurized to a third pressure P3 and a high-speed discharge stage (the high-speed depressurization stage III-B) in which the process space 102 of the chamber is depressurized to an initial pressure P0 similar to an atmospheric pressure may be performed sequentially.

For example, any one of 3-step control lines, that is, second control lines 402a, 402b, 402c of the fluid supply module 300, in which a plurality of first control valves 320a, 320b, 320c is installed respectively, may be selected to adjust the discharge rate without a mass flow controller. In an initial stage of the depressurization stage, the depressurization speed may be controlled in two or more steps to decrease the time required for the depressurization stage.

When a supercritical phase solvent is separated into a liquid phase and a vapor phase by a cooling effect below the critical pressure, a pattern collapse may occur due to contamination particles or surface tension. In particular, when the temperature of the supercritical phase solvent drops rapidly to a temperature below the critical point due to the adiabatic expansion of the supercritical phase solvent at the critical point above, the liquefied solvent may be condensed into a liquid phase thereby causing a failure in the dry process and pattern collapse. Accordingly, the depressurization speed may be adjusted in consideration of the phase behavior and the depressurization stage may be performed at a temperature higher than the critical temperature in consideration of the cooling effect, to thereby decrease the time required for the depressurization stage.

Figure 7:
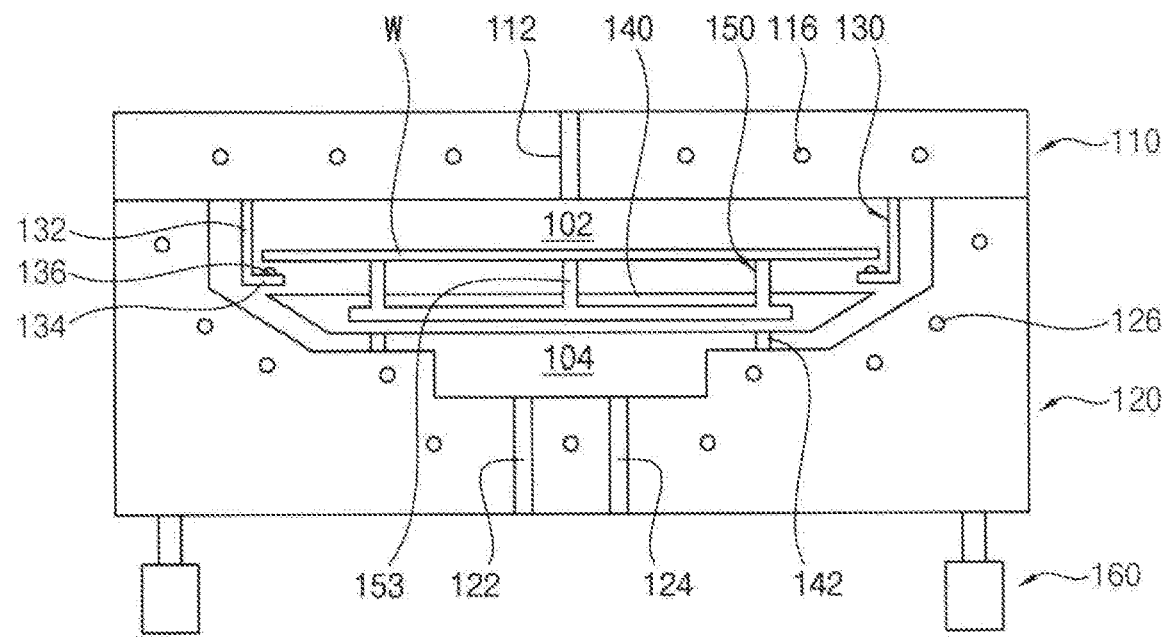
Figure 8:
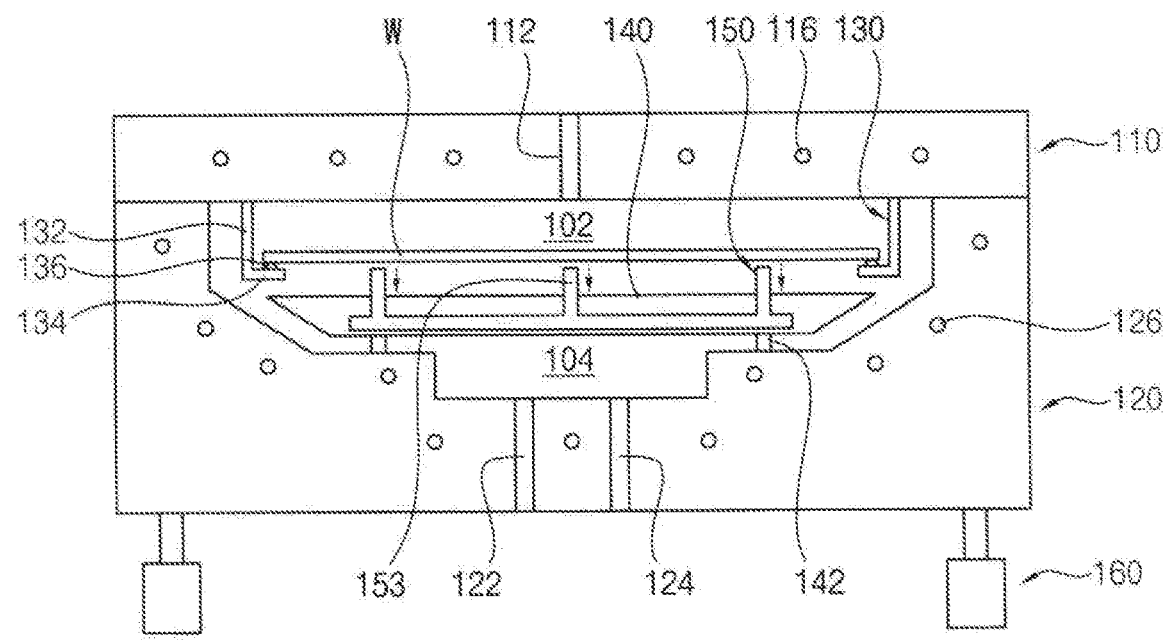
Figure 9:
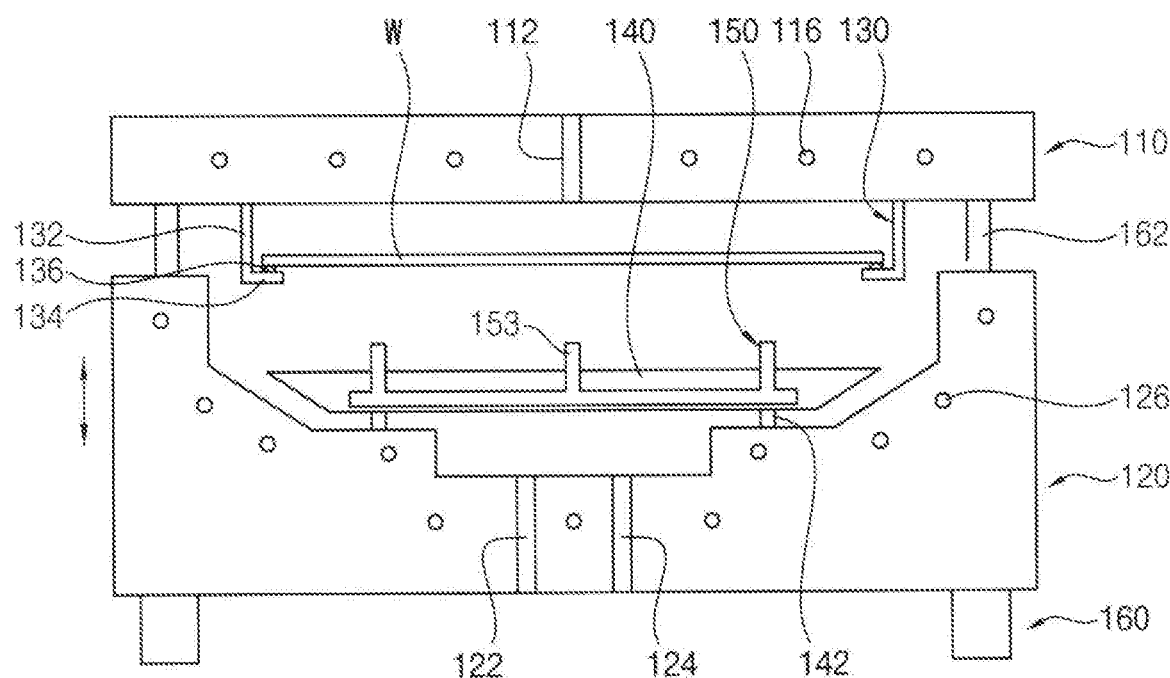

FIG. 7 is a cross-sectional view illustrating a substrate processing apparatus in accordance with some example embodiments. FIG. 8 is a cross-sectional view illustrating the substrate processing apparatus in FIG. 7, in which a second substrate support moves downward. FIG. 9 is a cross-sectional view illustrating the substrate processing apparatus in FIG. 7, in which a chamber is in an open state. The substrate processing apparatus may be substantially the same as or similar to the substrate processing apparatus described with reference to FIGS. 1 to 5 except for a construction of a second substrate support. Thus, same reference numerals will be used to refer to the same or like elements and any further repetitive explanation concerning the above elements will be omitted.

Referring to FIGS. 7 to 9, a second substrate support 150 of a substrate processing apparatus 101 may include a second support member which supports a substrate W at a desired height from a lower wall of a lower chamber 120.

In some example embodiments, the second support member may include a plurality of lift pins 153 which are installed movable upwardly and downwardly on a blocking plate 140. The lift pins 152 may extend vertically on the blocking plate 140 and contact a middle region of the substrate W to support the substrate W. As the lift pins 152 moves upward and downward, a height of a top end portion of the lift pin may be adjusted. Thus, the second substrate support 150 may support the substrate W in an adjustable height.

The substrate processing system 10 may include a memory and processing circuitry (not shown).

The memory may include may include a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The processing circuitry may include a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design and/or execution of computer readable instructions stored in the memory, as a special purpose computer to control the lift pins 152 to switch between a retracted state in which the lift pins 152 do not support the substrate W, and an extended state in which the lift pins 152 contact a middle region of the substrate W to support the substrate W.

As illustrated in FIG. 7, in a closed state of the chamber, the second substrate support 150 may support the substrate W in a height greater than a height in which a first substrate support 130 supports the substrate W. A first support member of the first substrate support 130 may support the substrate W in a first height from a bottom wall of the chamber, and the second support member of the second substrate support 150 may support the substrate W in a second height greater than the first height from the bottom wall of the chamber. A supercritical fluid process may be performed on the substrate W supported on the lift pins 153 of the second substrate support 150.

As illustrated in FIG. 8, after the supercritical fluid process is completed, in the closed state of the chamber, as the lift pins 153 moves downward, the substrate W may be seated on the first support member, that is, first support protrusions 136 of the first substrate support 130. Then, as illustrated in FIG. 9, the lower chamber 120 moves downward to open the chamber, and the substrate W may be unloaded from the chamber.

On the contrary, in an open state of the chamber as illustrated in FIG. 9, the substrate W may be loaded onto the first substrate support 130 within the chamber. Then, as illustrated in FIG. 8, the lower chamber 120 may move upward to close the chamber. Here, while the lift pins 153 move upward together with the lower chamber 120, the substrate W may be still supported on the first support protrusions 136 of the first substrate support 130. Then, as illustrated in FIG. 7, the lift pins 153 may move upward to contact the middle region of the substrate W to support the substrate W.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the example embodiments. Accordingly, all such modifications are intended to be included within the scope of example embodiments as defined in the claims.

What is claimed is:

1. A substrate processing apparatus, comprising:
   a chamber providing a space to process a substrate;
   a first substrate support within the chamber, the first substrate support configured to support the substrate when the chamber is in an open state to load the substrate into the chamber;
   a second substrate support within the chamber, the second substrate support configured to support the substrate when the chamber is in a closed state at a height greater than a height in which the first substrate support supports the substrate when the chamber is in the open state;
   a first supply port configured to supply a supercritical fluid to a first space under the substrate in the chamber;
   a second supply port configured to supply the supercritical fluid to a second space above the substrate in the chamber; and
   an exhaust port configured to exhaust the supercritical fluid from the chamber.

2. The substrate processing apparatus of claim 1, wherein the first substrate support includes a first support configured to support the substrate at a first height from a bottom wall of the chamber, and
   the second substrate support includes a second support configured to support the substrate at a second height from the bottom wall of the chamber, the second height being greater than the first height.

3. The substrate processing apparatus of claim 2, wherein the first support is configured to support a peripheral region of the substrate and
   the second support is configured to support a middle region of the substrate.

4. The substrate processing apparatus of claim 2, wherein the second support is further from side walls of the chamber than the first support.

5. The substrate processing apparatus of claim 2, wherein the first support comprises:
   a first vertical rod extending in a vertical direction downward from a top wall of the chamber; and
   a first horizontal rod extending in a horizontal direction from an end portion of the first vertical rod.

6. The substrate processing apparatus of claim 1, further comprising:
a blocking plate between the first supply port and the first substrate support, the blocking plate configured to block the supercritical fluid supplied from the first supply port from spraying directly toward the substrate.

7. The substrate processing apparatus of claim 6, wherein the second substrate support comprises:
a second support configured to support the substrate on the blocking plate.

8. The substrate processing apparatus of claim 7, wherein the second support comprises:
a plurality of second support protrusions extending upwardly from a top surface of the blocking plate.

9. The substrate processing apparatus of claim 7, wherein the second support comprises:
a plurality of lift pins configured to move upward and downward on the blocking plate.

10. The substrate processing apparatus of claim 1, wherein the chamber comprises:
an upper chamber and a lower chamber engageably clamped to each other, the upper chamber and the lower chamber configured to switch between a closed state where the chamber is closed and an open state where the chamber is open.

11. A substrate processing apparatus, comprising:
a chamber providing a space to process a substrate, the chamber including an upper chamber and a lower chamber engageably clamped to each other, the upper chamber and the lower chamber configured to switch between a closed state where the chamber is closed and an open state where the chamber is open;
a first substrate support within the chamber, the first substrate support configured to support the substrate when the chamber is in an open state to load the substrate into chamber;
a second substrate support within the chamber, the second substrate support configured to support the substrate while the chamber is in the closed state when the substrate is processed in the chamber at a height greater than a height in which the first substrate support supports the substrate when the chamber is in the open state;
a first supply port configured to supply a supercritical fluid to a first space under the substrate in the chamber;
a second supply port configured to supply the supercritical fluid to a second space above the substrate in the chamber; and
an exhaust port configured to exhaust the supercritical fluid from the chamber.

12. The substrate processing apparatus of claim 11, wherein
the first substrate support includes a first support configured to support the substrate at a first height from a bottom wall of the chamber, and
the second substrate support includes a second support configured to support the substrate at a second height from the bottom wall of the chamber, the second height being greater than the first height.

13. The substrate processing apparatus of claim 11, further comprising:
a blocking plate between the first supply port and the first substrate support, the blocking plate configured to block the supercritical fluid supplied from the first supply port from being sprayed directly toward the substrate.

14. The substrate processing apparatus of claim 13, wherein the second substrate support comprises:
a second support configured to support the substrate on the blocking plate.

15. A substrate processing apparatus comprising:
a chamber;
a first support system configured to support a substrate from a periphery of the substrate, if the chamber is in an open state; and
a second support system configured to support the substrate from a middle portion thereof while the substrate is not supported by the first support system, if the chamber is in a closed state.

16. The substrate processing apparatus of claim 15, wherein
the first support system is connected to a top wall of the chamber, and
the second support system is connected to a bottom wall of the chamber.

17. The substrate processing apparatus of claim 16, wherein
the first support system is configured to support the substrate at a first height from the bottom wall of the chamber, and
the second support system is configured to support the substrate at a second height from the bottom wall of the chamber, the second height being greater than the first height.

18. The substrate processing apparatus of claim 15, wherein the chamber includes an upper chamber and a lower chamber, the upper chamber and the lower chamber configured to move relative to each other to switch between the open state where the substrate is supported by the first support system and the closed state where the substrate is supported by the second support system.

19. The substrate processing apparatus of claim 15, wherein the second support system comprises:
a plurality of lift pins configured to move on a blocking plate between a retracted state and an extended state such that the substrate is supported by the first support system when the plurality of lift pins are in the retracted state and the substrate is supported by the second support system when the plurality of lift pins are in the extended state.

* * * * *